US00RE46147E

(19) United States
(12) Reissued Patent
Yanagida

(10) Patent Number: US RE46,147 E
(45) Date of Reissued Patent: Sep. 13, 2016

(54) SEMICONDUCTOR DEVICE AND METHOD OF FABRICATING THE SAME

(71) Applicant: Sony Corporation, Tokyo (JP)

(72) Inventor: Toshiharu Yanagida, Tokyo (JP)

(73) Assignee: Sony Corporation, Tokyo (JP)

(21) Appl. No.: 14/230,695

(22) Filed: Mar. 31, 2014

Related U.S. Patent Documents

Reissue of:
(64) Patent No.: 6,545,355
Issued: Apr. 8, 2003
Appl. No.: 09/313,172
Filed: May 18, 1999

(30) Foreign Application Priority Data

May 22, 1998 (JP) ..... 10-141481

(51) Int. Cl.
*H01L 23/48* (2006.01)
*H01L 21/4763* (2006.01)
*H01L 23/00* (2006.01)

(52) U.S. Cl.
CPC ..... *H01L 23/48* (2013.01); *H01L 21/4763* (2013.01); *H01L 24/05* (2013.01); *H01L 2224/05022* (2013.01); *H01L 2224/1147* (2013.01); *H01L 2224/131* (2013.01); *H01L 2924/01004* (2013.01); *H01L 2924/01013* (2013.01); *H01L 2924/01018* (2013.01); *H01L 2924/01022* (2013.01); *H01L 2924/01027* (2013.01); *H01L 2924/01029* (2013.01); *H01L 2924/01042* (2013.01)

(58) Field of Classification Search
CPC ..... H01L 21/44; H01L 23/48; H01L 2924/01079; H01L 2924/01029; H01L 2924/01013
USPC ..... 438/612, 613, 614, 628, 644, 656; 257/737, 738, 780
See application file for complete search history.

(56) References Cited

U.S. PATENT DOCUMENTS 4,514,751 A * 4/1985 Bhattacharya ..... 357/71
4,764,804 A * 8/1988 Sahara et al. ..... 357/81
5,329,423 A * 7/1994 Scholz ..... 257/692

(Continued)

FOREIGN PATENT DOCUMENTS

JP 02-010840 1/1990
JP 06-268358 9/1994

(Continued)

OTHER PUBLICATIONS

Japanese Office Actions issued Apr. 4, 2006 for corresponding Japanese Application No. 10-141481.

(Continued)

*Primary Examiner* — Tuan H Nguyen
(74) *Attorney, Agent, or Firm* — Michael Best & Friedrich LLP

(57) ABSTRACT

An adhesion layer made from Al film or Ti film is formed on Cu electrode pad portions as external connection terminals of a Cu interconnection layer of an LSI formed on the surface layer of a semiconductor substrate. A BLM film having a stacked structure of Cr/Cu/Au or Ti/Cu/Au is formed on the adhesion layer. Solder ball bumps made from Pb and Sn are formed on the BLM film. The adhesion layer ensures a high adhesion strength and a high electric contact characteristic between the Cu electrode pad portions and the BLM film, that is, between the Cu electrode pads and the solder ball bumps.

22 Claims, 6 Drawing Sheets

(56) References Cited

U.S. PATENT DOCUMENTS

| | | | | | |
|---|---|---|---|---|---|
| 5,376,584 | A | * | 12/1994 | Agarwala | 438/614 |
| 5,503,286 | A | | 4/1996 | Nye, III et al. | |
| 5,604,379 | A | * | 2/1997 | Mori | 257/738 |
| 5,640,052 | A | * | 6/1997 | Tsukamoto | 257/781 |
| 5,656,858 | A | * | 8/1997 | Kondo et al. | 257/737 |
| 5,731,624 | A | | 3/1998 | Motsiff et al. | |
| 5,767,010 | A | * | 6/1998 | Mis et al. | 438/614 |
| 5,773,359 | A | * | 6/1998 | Mitchell et al. | 438/614 |
| 5,796,136 | A | * | 8/1998 | Shinkawata | 257/306 |
| 5,796,591 | A | * | 8/1998 | Dalal et al. | 257/738 |
| 5,834,844 | A | * | 11/1998 | Akawa et al. | 257/734 |
| 5,844,320 | A | * | 12/1998 | Ono et al. | 257/778 |
| 5,844,782 | A | * | 12/1998 | Fukasawa | 257/786 |
| 5,883,435 | A | * | 3/1999 | Geffkem et al. | 257/758 |
| 5,903,058 | A | * | 5/1999 | Akram | 257/778 |
| 5,912,510 | A | * | 6/1999 | Hwang et al. | 257/778 |
| 5,925,931 | A | * | 7/1999 | Yamamoto | 257/737 |
| 5,937,320 | A | | 8/1999 | Andricacos et al. | |
| 5,959,363 | A | * | 9/1999 | Yamada et al. | 257/787 |
| 5,962,918 | A | * | 10/1999 | Kimura | 257/738 |
| 5,977,632 | A | * | 11/1999 | Beddingfield | 257/737 |
| 5,998,861 | A | * | 12/1999 | Hiruta | 257/700 |
| 6,016,013 | A | * | 1/2000 | Baba | 257/778 |
| 6,028,357 | A | * | 2/2000 | Moriyama | 257/737 |
| 6,075,290 | A | * | 6/2000 | Schaefer et al. | 257/737 |
| 6,713,381 | B2 | * | 3/2004 | Barr et al. | 438/622 |

FOREIGN PATENT DOCUMENTS

| | | |
|---|---|---|
| JP | 08-203907 | 8/1996 |
| JP | 08-330360 | 12/1996 |
| JP | 09-074096 | 3/1997 |
| JP | 09-082711 | 3/1997 |
| JP | 09-148331 | 6/1997 |
| JP | 09-260389 | 10/1997 |

OTHER PUBLICATIONS

Japanese Office Actions issued Aug. 8, 2006 for corresponding Japanese Application No. 10-141481.

* cited by examiner

SEMICONDUCTOR DEVICE AND METHOD OF FABRICATING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATION DATA

The present application *is a reissue application of application Ser. No. 09/313,172, now U.S. Pat. No. 6,545,355, issued Apr. 8, 2003, which* claims priority to Japanese Application No. P10-141481 filed May 22, 1998, which application is incorporated herein by reference to the extent permitted by law.

BACKGROUND OF THE INVENTION

The present invention relates to a semiconductor device and a method of fabricating the semiconductor device, and particularly to a semiconductor device in which solder bumps are formed on electrode pads via a barrier metal film is and a method of fabricating the semiconductor device.

To increasingly progress miniaturization of electronic equipment, it is important how improve the mounting density of electronic parts. With respect to semiconductor ICs (Integrated Circuits), studies have been actively made to develop such a high density mounting technology as to directly mount a bare chip on a printed wiring board, typically a flip-chip mounting method in place of the conventional packaging method.

The flip-chip mounting method is represented by an Au (gold) stud bump method or a solder ball bump method, and further, it includes various other methods covering a wide range from those at the prototype stage to those at the commercially practical stage. The present applicant has developed in advance of time a mass-production technology for forming solder ball bumps on a wafer level including a number of chips by applying the LSI (Large-Scale Integrated Circuit) fabrication process, and has filed a number of the associated patent applications and simultaneously put consumer-oriented equipment produced on the basis of such a technology, for example, a micro digital camcorder, to thus early commercialize the next-generation LSI mounting technology.

In formation of solder ball bumps, a barrier metal film is provided between Al (aluminum) based electrode pads of an LSI and the bumps in order to improve the adhesion between the electrode pads and the bumps and prevent the mutual diffusion therebetween. In particular, for the solder ball bump method, since the barrier metal film exerts a large effect on the finished shapes of bumps, such a film is generally called a BLM (Ball Limiting Metal) film.

In general, the BLM film used for solder bumps has a three-layer structure of Cr (chromium) film/Cu (copper) film/Au film. In this three-layer structure, the bottom Cr film functions as an adhesion layer for ensuring good adhesion with Al electrode pads; the intermediate Cu film functions as a barrier layer for preventing the diffusion of solder from solder bumps; and the top Au film functions as an oxidation preventive film for preventing the oxidation of the Cu film.

A related art method of forming solder bumps using such a BLM film will be described below with reference to FIGS. 8 to 12.

First, an Al based electrode pad 32 made from Al or an Al—Cu alloy is formed on a connection of a flip-chip IC (not shown) formed on the surface of a semiconductor substrate 30. The entire surface of the substrate is covered with a passivation film (surface protective film) 34 made from polyimide film or silicon nitride film, and a BLM film 36 is formed in such a manner as to be connected to the Al based electrode pad 32 via a connection hole opened in the passivation film 34 (see FIG. 8).

The entire surface of the substrate is coated with a sufficiently thick photoresist film 38, and the photoresist film 38 is patterned by photolithography to form an opening 40 having a diameter being large enough to expose the BLM film 36 and a portion of the passivation film 34 around the BLM film 36 (see FIG. 9).

A solder vapor-deposition film 42 made from Pb (lead) and Sn (tin) is formed over the entire surface of the substrate by use of, for example a vapor-deposition method. At this time, since the end, positioned at the edge of the opening 40, of the photoresist film 38 is largely stepped, the solder vapor-deposition film 42 is divided into a solder vapor-deposition film 42a located on both the BLM film 36 and the portion of the passivation film 34 around the BLM film 34 in the opening 40 and a solder vapor-deposition film 42b located on the photoresist film 38 (see FIG. 10).

The solder vapor-deposition film 42b located on the photoresist film 38 is removed together with the photoresist film 38 by a lift-off method. The lift-off method is performed by dipping the wafer in a resist separation solution and heating/oscillating the wafer in the solution, to lift-off the photoresist film 38. In this way, only the solder vapor-deposition film 42a, which covers the BLM film 36 and the portion of the passivation film 34 around the BLM film 36, remains (see FIG. 11).

The solder vapor-deposition film 42a is then subjected to wet-back treatment. That is to say, the solder vapor-deposition film 42a is coated with flux and is fused by heat-treatment, to finally form a solder ball bump 44 connected to the BLM film 36. In this way, a semiconductor device is fabricated, in which the solder ball bumps 44 are formed via the BLM film 36 on the Al based electrode pads 32 formed on the connections of the flip-chip IC formed on the surface of the semiconductor substrate 30 (see FIG. 12).

While Al has been used as an interconnection material of LSIs for a long time, the use of Al has come to cause serious problems associated with delay of signals or deterioration in the reliability in multiple interconnection layers along with tendency toward higher integration, finer-geometries, and higher operational speed of LSIs.

In place of such a conventional material Al, Cu (copper) is expected as an interconnection material of the next-generation LSIs and is nearing practical use. Cu has a resistivity lower about 40% than that of Al (the resistivity of Al is about 2.8 μΩcm while the resistivity of Cu is about 1.7 μΩcm), and further Cu has a high resistance against electromigration. Accordingly, the use of Cu is expected to further reduce the resistance of the LSIs and improve the reliability thereof.

However, since the above-described process of forming solder ball bumps on electrode pads via a BLM film is predicated on the use of Al based electrode pads, if such a process is applied to an LSI using Cu electrode pads as terminals of Cu interconnections in place of the conventional Al based electrode pads as terminals of Al based interconnections, there may occur the following problem. Namely, since the adhesion strength between the BLM film and the Cu electrode pads is lowered, there may easily arise the falling of solder ball bumps from a semiconductor chip upon mounting of the semiconductor chip on a printed wiring board or the failure in electric contact characteristic between the Cu electrode pads and the solder ball bumps when the semiconductor chip undergoes a temperature cycle or a high temperature load, thereby exerting adverse effect on the device reliability.

Consequently, it is desired to establish a fabrication process of stably forming solder ball bumps with a high-reliability to the next-generation LSIs adopting a Cu interconnection material.

SUMMARY OF THE INVENTION

An object of the present invention is to provide a semiconductor device with a high-reliability and a high-durability, which is capable of forming solder bumps on electrode pads made from a metal other than Al without degrading the adhesion strength between the electrode pads and the solder bumps and the electric contact characteristic therebetween, and to provide a method of fabricating the semiconductor device.

To achieve the above object, according to a first aspect of the present invention, there is provided a semiconductor device including: electrode pads provided on a base; and solder bumps formed on the electrode pads via a barrier metal film; wherein an adhesion layer is formed between the electrode pads and the barrier metal film for increasing the adhesion therebetween.

The electrode pads is preferably made from Cu or an alloy containing Cu (hereinafter, these pads are referred to as "Cu based electrode pads").

The adhesion layer is preferably made from at least one kind of metal selected from a group consisting of Al, Ti (titanium), Cr, Co (cobalt), Ni (nickel), Mo (molybdenum), Ag (silver), Ta (tantalum), W (tungsten) and Au, or an alloy containing the at least one kind of metal.

In the semiconductor device according to the first aspect of the present invention, since the adhesion layer is formed between the electrode pads and the barrier metal for increasing the adhesion therebetween, even if the electrode pads are changed from the convention Al based electrode pads into the Cu based electrode pads, it is possible to prevent degradation of the adhesion strength between the Cu based electrode pads and the solder bumps and the failure of the electric contact characteristic therebetween. That is to say, in order to keep up with the next-generation high speed LSIs adopting Cu based interconnections, the function of the barrier metal film having been used for improving the adhesion between electrode pads and solder bumps is reinforced by provision of the adhesion layer.

Accordingly, the solder ball bumps appropriate to the next-generation high speed LSI adopting the Cu interconnection layer can be formed, and since the barrier metal function is reinforced by adding the adhesion layer to the conventional barrier metal film, even if various heat-treatments are applied to the substrate after formation of the solder layer, it is possible to effectively prevent thermal diffusion of solder, and hence to obtain good electric contact characteristic between the finally formed solder bumps and the Cu based electrode pads and also increase the adhesion strength therebetween. This makes it possible to improve the reliability and durability of a device product on which the semiconductor chip is mounted by the flip-chip mounting method. In summary, according to the semiconductor device of the first aspect of the present invention, it is possible to improve the electric contact characteristic, reliability, and durability of a device product on which the next-generation high speed LSI chip adopting Cu interconnections is mounted by the flip-chip mounting method.

According to a second aspect of the present invention, there is provided a method of fabricating a semiconductor device in which solder bumps are formed on electrode pads provided on a base via a barrier metal film, the method including: a first step of forming a passivation film in such a manner as to cover electrode pads; forming a resist film on the passivation film and patterning the resist film into a specific shape; and selectively etching the passivation film using the resist film as a mask to expose the electrode pads; a second step of forming an adhesion film over the entire surface of the base; and removing a first portion, located on the resist film, of the adhesion film together with the resist film by a lift-off method, to allow only a second portion, located on the electrode pads, of the adhesion layer to remain; and a third step of forming solder bumps on the second portion of the adhesion layer located on the electrode pads via a barrier metal film.

The second step preferably includes a step of forming the adhesion layer over the entire surface of the base by a sputtering method, an electrolytic plating method, or a CVD (Chemical Vapor Deposition) method.

In the method of fabricating a semiconductor device according to the second aspect of the present invention, the passivation film is selectively etched using the resist film patterned into a specific shape as a mask to expose the electrode pads, and of the adhesion layer formed over the entire surface of the base, the unnecessary portion of the adhesion layer located on the resist film is removed together with the resist film by lifting-off the resist film, to allow only the portion of the adhesion layer located on the electrode pads to remain. That is to say, the resist film patterned into a specific shape is used for both the etching mask and the lift-off film. Accordingly, it is possible to eliminate the necessity for provision of the step of forming a resist film for forming the adhesion layer only on the electrode pads and the lithography step for patterning the resist film, and hence to effectively form the adhesion layer in self-alignment over the entire surfaces of the electrode pads exposed by selective etching of the passivation film without increasing the number of processing steps.

Accordingly, even if the electrode pads are changed from the Al based electrode pads into the Cu based electrode pads, the adhesion layer can be effectively formed in self-alignment on the entire surfaces of the Cu based electrode pads. This makes it possible to increase the adhesion between the Cu based electrode pads and the barrier metal film and hence to prevent the degradation of adhesion strength between the Cu based electrode pads and the solder bumps and the failure in electric contact characteristic therebetween. In summary, according to the method of fabricating the semiconductor device of the second aspect of the present invention, it is possible to improve the electric contact characteristic, reliability, and durability of a device product on which the next-generation high speed LSI chip adopting Cu interconnections is mounted by the flip-chip mounting method.

While description has been made of the case adopting a Cu based material as the interconnection material of the next-generation high speed LSI, the present invention is not limited thereto. Even if a metal other than Cu is adopted as the interconnection material, the present invention can keep up with the future LSIs by selecting the material of the adhesion layer for increasing the adhesion between electrode pads and a barrier metal film in consideration of the new interconnection material other than Cu.

In this way, the semiconductor device and the fabrication method thereof according to the present invention is very useful to realize a semiconductor device designed on the basis of the fine design rule and required having high-integration, high-performance, and high-reliability.

DETAILED DESCRIPTION OF THE PREFERRED EMBODIMENTS

Hereinafter, embodiments of the present invention will be described with reference to the accompanying drawings.

Figure 1:
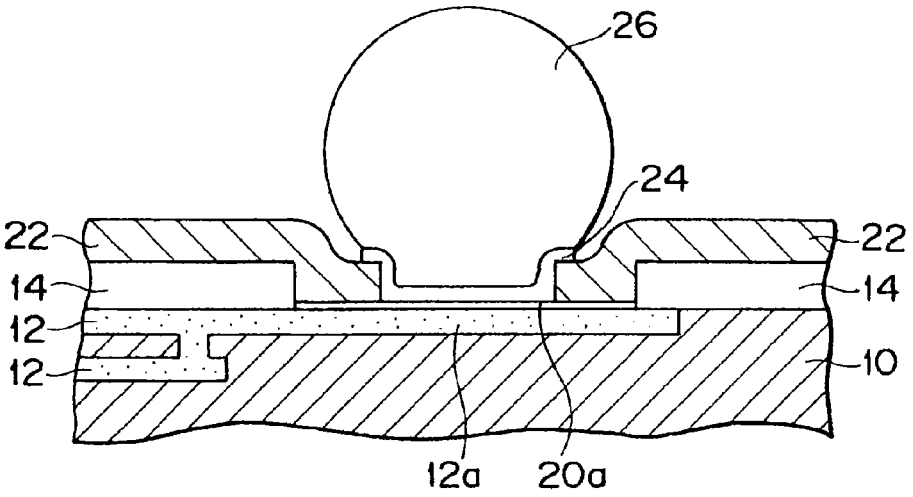
FIG. 1 is a sectional view showing a semiconductor device according to one embodiment of the present invention, in which a BLM film is formed on a Cu electrode pad portion of an LSI via an adhesion layer and a solder ball bump is formed on the BLM film.

FIG. 1 is a sectional view showing a semiconductor device according to one embodiment of the present invention, and FIGS. 2 to 7 are sectional views illustrating sequential steps of a method of fabricating the semiconductor device shown in FIG. 1.

As shown in FIG. 1, a LSI (not shown) formed in a surface layer of a semiconductor substrate 10 is subjected to multilayer interconnection by a Cu interconnection layer 12, and the entire surface of the substrate 10 is covered with a silicon nitride film 14 as a passivation film.

A portion, over a Cu electrode pad portion 12a as an external connection terminal of the Cu interconnection layer 12, of the silicon nitride film 14 is selectively removed, and an adhesion layer 20a made from Al film or Ti film is formed on the Cu electrode pad portion 12a.

The adhesion layer 20a and the silicon nitride film 14 are further covered with a polyimide film 22 as a passivation film. A portion, over the adhesion layer 20a, of the polyimide film 22 is selectively removed, and a BLM film 24 having a stacked structure of Cr/Cu/Au or Ti/Cu/Au is formed on the adhesion layer 20a.

A solder ball bump 26 made from Pb and Sn is formed on the BLM film 24.

The method of fabricating the semiconductor device shown in FIG. 1 will be described with reference to FIGS. 2 to 7.

First, an LSI (not shown) is formed in a surface layer of the semiconductor substrate 10, and is subjected to multilayer interconnection using a Cu interconnection layer 12. A silicon nitride film 14 as a passivation film is formed on the entire surface of the substrate 10.

Figure 2:
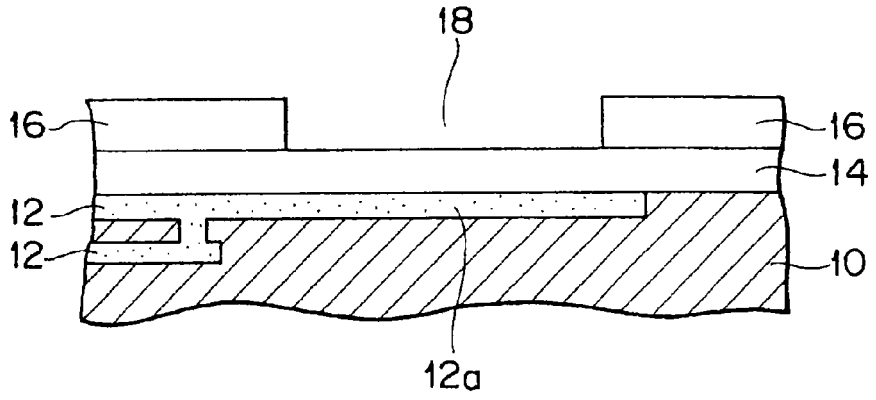
FIG. 2 is a sectional view illustrating a first step of a method of fabricating the semiconductor device shown in FIG. 1, in which a resist film having a pad opening is formed on a silicon nitride film as a passivation film.
Figure 3:
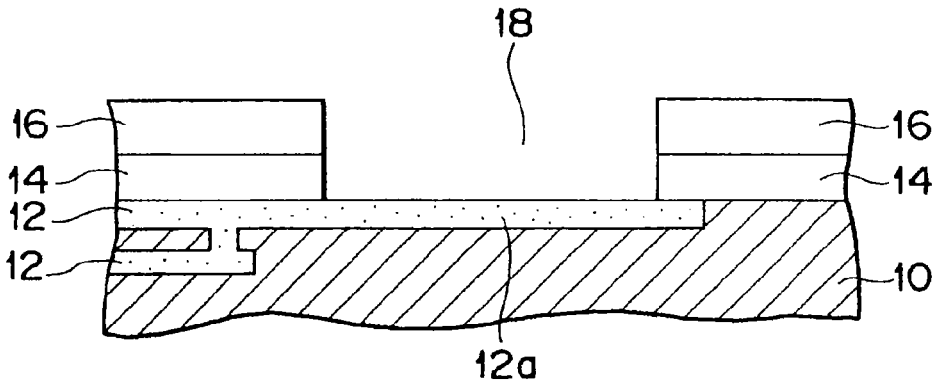
FIG. 3 is a sectional view illustrating a second step of the method of fabricating the semiconductor device shown in FIG. 1, in which the surface of the Cu electrode pad is exposed by selective dry etching of the silicon nitride film.
Figure 4:
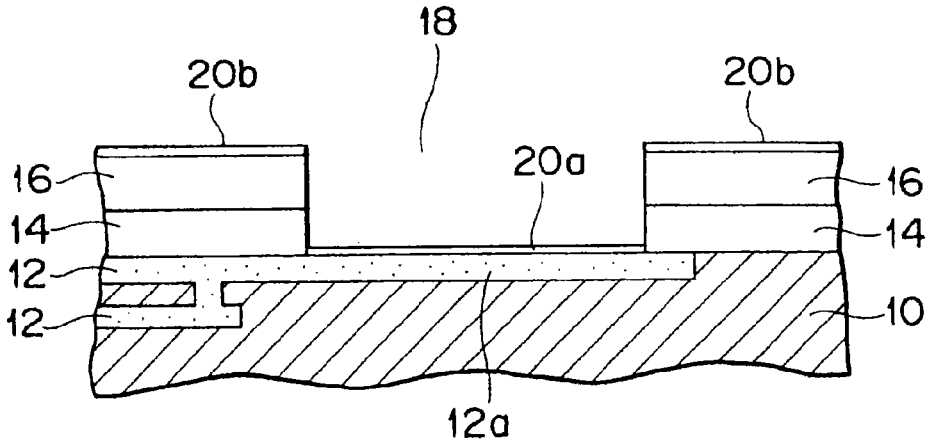
FIG. 4 is a sectional view illustrating a third step of the method of fabricating the semiconductor device shown in FIG. 1, in which the adhesion layer is divided into a portion on the Cu electrode pad portion in the pad opening and a portion formed on the resist film.
Figure 5:
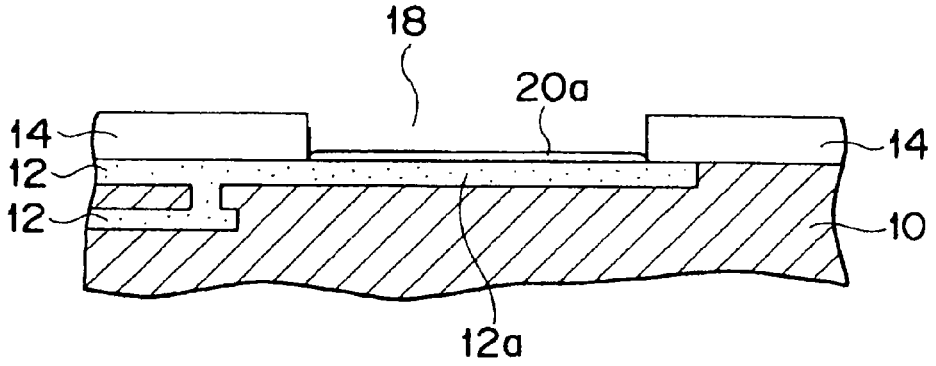
FIG. 5 is a sectional view illustrating a fourth step of the method of fabricating the semiconductor device shown in FIG. 1, in which the unnecessary portion of the adhesion layer located on the resist film is removed together with the resist film by lifting-off the resist film, to allow only the portion of the adhesion layer located on the Cu electrode pad in the pad opening to remain.

The silicon nitride film 14 is coated with a resist film 16, and the resist film 16 is patterned into a specific shape by photolithography, to form a pad opening 18 in the resist film 16 at a position over a Cu electrode pad portion 12a as an external connection terminal of the Cu interconnection layer 12 (see FIG. 2).

The semiconductor substrate 10 is set in a magnetron RIE (Reactive Ion Etching) apparatus. The silicon nitride film 14 is selectively removed by dry etching using the resist film 16 having the pad opening 18 as a mask, to expose the surface of the Cu electrode pad portion 12a in the pad opening portion 18 (see FIG. 3).

The semiconductor substrate 10 is set in a sputter apparatus. The entire surface of the substrate 10 is subjected to pre-treatment for film formation by RF (Radio Frequency) plasma, and an adhesion layer 20 made from Al film or Ti film is formed by sputtering on the entire surface of the substrate 10. Of the adhesion layer 20, an adhesion layer 20a is formed on the Cu electrode pad portion 12a exposed in the pad opening 18, and an unnecessary adhesion layer 20b is formed on the resist film 16. To be more specific, the adhesion layers 20a and 20b are separated from each other by the stepped portion having a thickness equivalent to the total thickness of the resist film 16 and the silicon nitride film 14 at the edge of the pad opening 18 (see FIG. 4).

The semiconductor substrate 10 is dipped in a resist separation solution, followed by heating and oscillation, to remove the resist film 16. At this time, the unnecessary adhesion layer 20b on the resist film 16 is removed together with the resist film 16 by lifting-off the resist film 16. In this way, only the adhesion layer 20a remains on the Cu electrode pad portion 12a in the pad opening portion 18 (see FIG. 5).

A polyimide film 22 as a passivation film is formed on the entire surface of the substrate. A portion, over the adhesion layer 20a, of the polyimide film 22 is selectively removed by etching, to form an opening from which the adhesion layer 20a is exposed.

Figure 6:
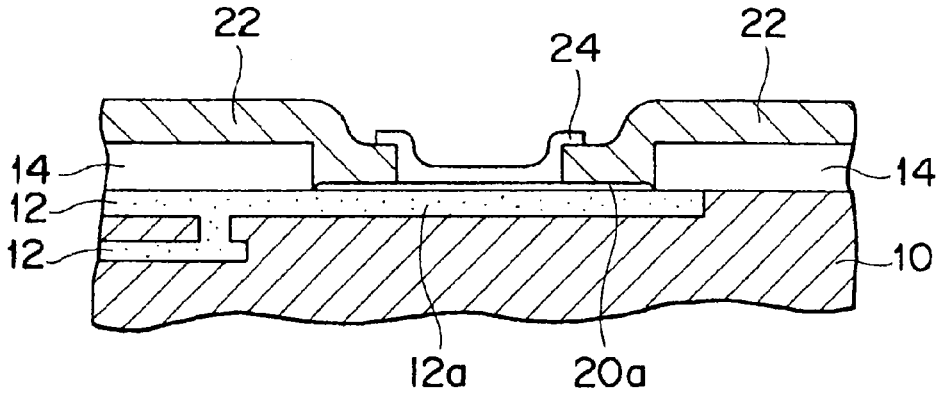
FIG. 6 is a sectional view illustrating a fifth step of the method of fabricating the semiconductor device shown in FIG. 1, in which a BLM film is formed in such a manner as to be connected to the adhesion layer via an opening formed in a polyimide film as a passivation film.

Then, a BLM film 24 is formed in such a manner as to be connected to the adhesion layer 20a via the opening in accordance with the same manner as that in the related art fabrication method, for example, using the lift-off method and sputtering method (see FIG. 6). The lift-off method and sputtering method may be replaced with the sputtering method and etching method.

A high melting point vapor-deposition film (Pb:Sn=97:3) is formed in such a manner as to cover only the BLM film 24 and a portion of the polyimide film 22 around the BLM film 24 in accordance with the same manner as that in the related art fabrication method shown in FIGS. 8 to 12 using the lift-off method and vacuum vapor-deposition method. The high melting point vapor-deposition film is then subjected to wet-back. To be more specific, the high melting point vapor-deposition film is coated with flux and is fused by heating, to form a solder bump 26 made from Pb and Sn connected to the BLM film 24. The lift-off method and vacuum vapor-deposition method may be replaced with an electrolytic plating method or printing method.

Figure 7:
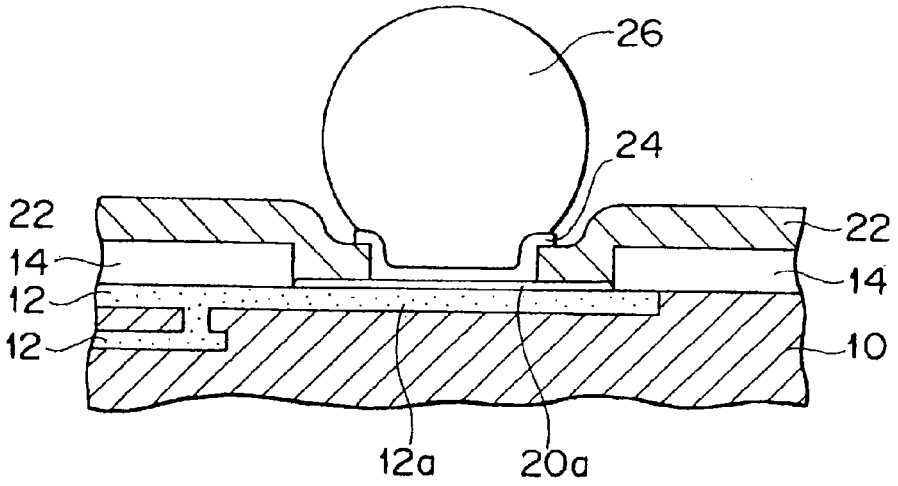
FIG. 7 is a sectional view illustrating a sixth step of the method of fabricating the semiconductor device shown in FIG. 1, in which a solder ball bump is formed on the BLM film.
Figure 8:
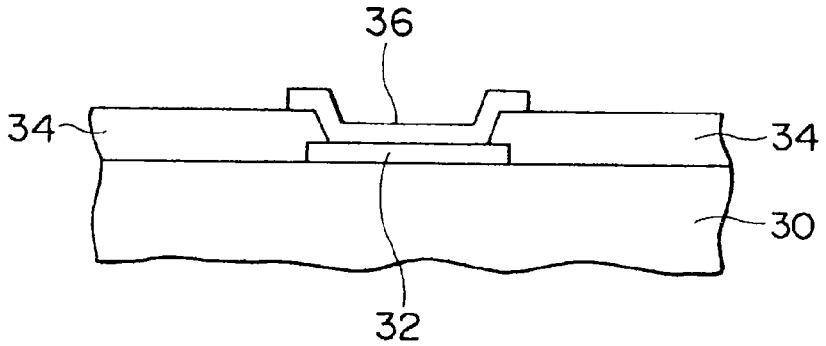
FIG. 8 PRIOR ART
FIG. 8 is a sectional view illustrating a first step of a related art method of forming solder bumps, in which a BLM film is formed in such a manner as to be connected to an Al based electrode pad via a connection hole opened in a passivation film formed on a semiconductor substrate.
Figure 9:
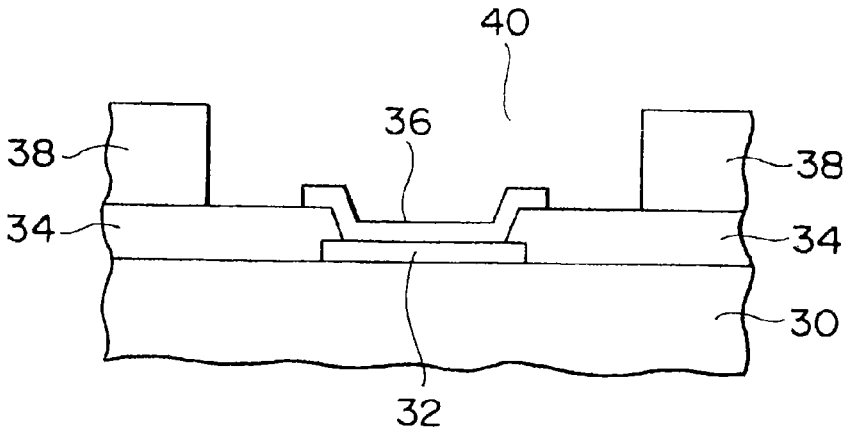
FIG. 9 PRIOR ART
FIG. 9 is a sectional view illustrating a second step of the related art method of forming solder bumps, in which an opening for exposing the Al based electrode pad and a portion of the passivation film around the Al based electrode pad is formed in a sufficiently thick photoresist film.
Figure 10:
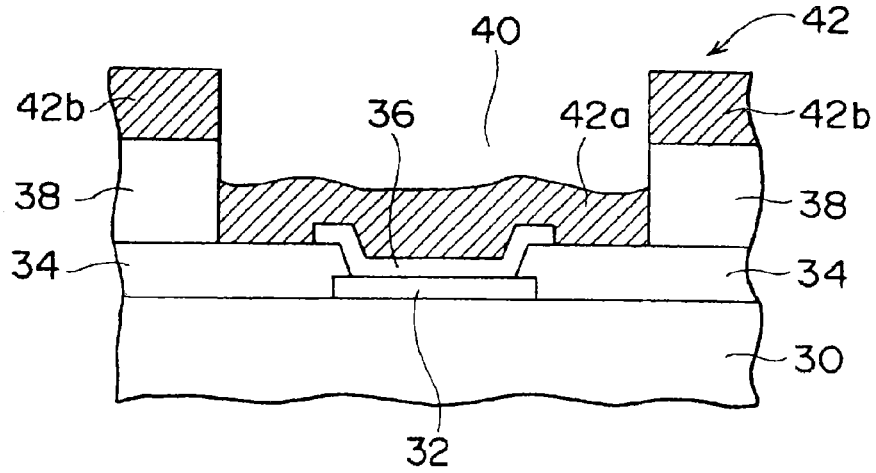
FIG. 10 PRIOR ART
FIG. 10 is a sectional view illustrating a third step of the related art method of forming solder bumps, in which a solder vapor-deposition film is formed in such a manner as to be divided into one on the BLM film and the portion of the passivation film around the BLM film in the opening and the other on the photoresist film.
Figure 11:
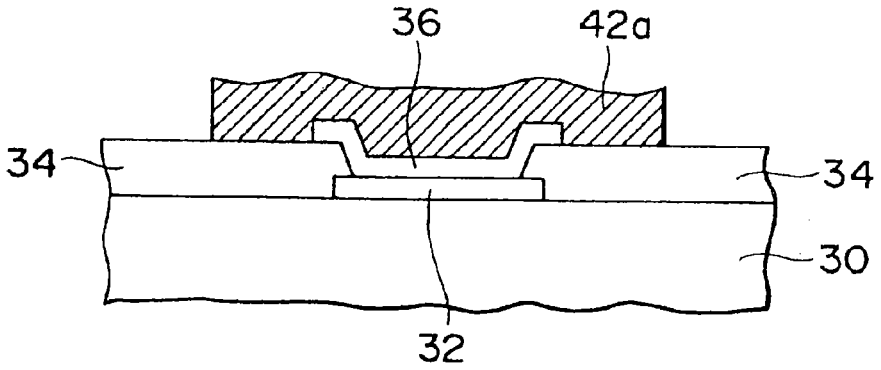
FIG.11 PRIOR ART
FIG. 11 is a sectional view illustrating a fourth step of the related art method of forming solder bumps, in which a portion of the solder vapor-deposition film covering the bottom surface in the opening including the BLM film is allowed to remain by a lift-off method.
Figure 12:
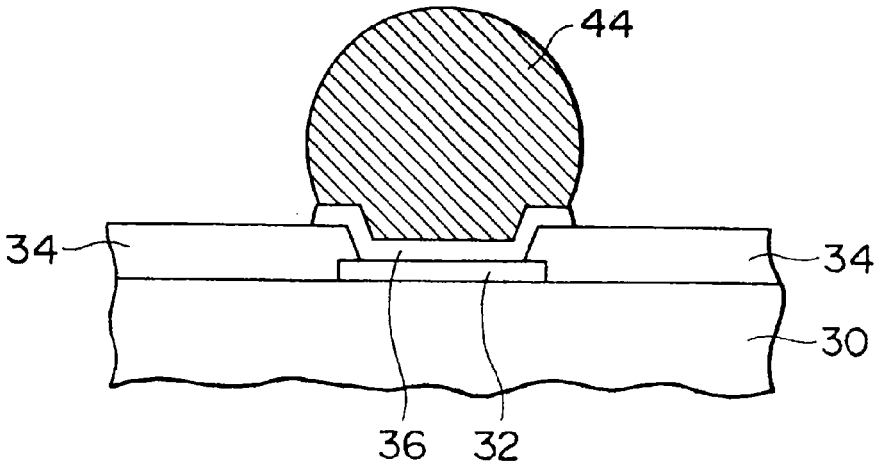
FIG.12 PRIOR ART
FIG. 12 is a sectional view illustrating a fifth step of the related art method of forming solder bumps, in which a solder ball bump is formed on the Al based electrode pad via the BLM film by heating and fusing the solder vapor-deposition film using a wet-back method.

In this way, a semiconductor device shown in FIG. 7 is obtained, in which the BLM film 24 is formed via the adhesion layer 20a on the Cu electrode pad portion 12a as an external connection terminal of the Cu interconnection layer 12 of the LSI (not shown) formed in the surface layer of the semiconductor substrate 10, and the solder ball bump 26 is formed on the BLM film 24.

Hereinafter, the etching condition for the silicon nitride film 14, the formation condition for the adhesion layers 20a and 20b, and the formation condition for the BLM film 24 in the above-described embodiment of the present invention will be described with reference to the following examples.

EXAMPLE 1

The selective etching of the silicon nitride film 14 with the resist film 16 taken as a mask was performed using the magnetron RIE apparatus under the following condition:

flow rate of reactive gas: $C_4F_8$/CO=10/90 sccm
pressure: 2.0 Pa
RF power: 2.2 W/cm$^2$
strength of magnetic field: 150 Gauss The formation of an Al film as the adhesive layers 20a and 20b was performed using a normal sputter apparatus under the following condition:

DC power: 4.0 kW
flow rate of atmospheric gas: Ar=100 sccm
pressure: 0.5 Pa
temperature of wafer stage: room temperature
thickness of Al adhesion layer: 0.1 μm The formation of each of films constituting the BLM film 24 having the stacked structure of Cr/Cu/Au was performed by a normal sputter apparatus under the following condition:

(1) Formation Condition of Cr Film
DC power: 3.0 kW
flow rate of atmospheric gas: Ar=75 sccm
pressure: 1.0 Pa
temperature of wafer stage: 50° C.
thickness of Cr film: 0.1 μm
(2) Formation Condition of Cu Film
DC power: 9.0 kW
flow rate of atmospheric gas: Ar=100 sccm
pressure: 1.0 Pa
temperature of wafer stage: 50° C.
thickness of Cu film: 1.0 μm
(3) Formation Condition of Au Film
DC power: 3.0 kW
flow rate of atmospheric gas: Ar=75 sccm
pressure: 1.5 Pa
temperature of wafer stage: 50° C.
thickness of Au film: 0.1 μm

EXAMPLE 2

The selective etching for the silicon nitride film 14 with the resist film 16 taken as a mask using the magnetron RIE apparatus under the following condition:

flow rate of reactive gas: $C_4F_8$/CO=10/90 sccm
pressure: 2.0 Pa
RF power: 2.2 W/cm$^2$
strength of magnetic field: 150 Gauss The formation of a Ti film as the adhesive layers 20a and 20b was performed using a normal sputter apparatus under the following condition:

DC power: 5.0 kW
flow rate of atmospheric gas: Ar=100 sccm
pressure: 0.5 Pa
temperature of wafer stage: room temperature
thickness of Ti adhesion layer: 0.1 μm The formation of each of films constituting the BLM film 24 having the stacked structure of Ti/Cu/Au was performed using a normal sputter apparatus under the following condition:

(1) Formation Condition of Ti Film
DC power: 4.0 kW
flow rate of atmospheric gas: Ar=75 seem
pressure: 1.0 Pa
temperature of wafer stage: 50° C.
thickness of Ti film: 0.05 μm
(2) Formation Condition of Cu Film
DC power: 9.0 kW
flow rate of atmospheric gas: Ar=100 sccm
pressure: 1.0 Pa
temperature of wafer stage: 50° C.
thickness of Cu film: 1.0 μm
(3) Formation Condition of Au Film
DC power: 3.0 kW
flow rate of atmospheric gas: Ar=75 sccm
pressure: 1.5 Pa
temperature of wafer stage: 50° C.
thickness of Au film: 0.1 μm As described above, according to this embodiment, since the adhesion layer 20a made from Al film or Ti film is formed between the Cu electrode pad portion 12a as an external connection terminal of the Cu interconnection layer 12 and the BLM film 24 having the stacked structure of Cr/Cu/Au or Ti/Cu/Au, it becomes possible to enhance adhesion between the Cu electrode pad portion 12a and the BLM film 24. As a result, even if the material of an interconnection layer of an LSI is changed from Al (conventional material) to Cu, it becomes possible to prevent the adhesion strength between the Cu electrode pad portion 12a and the BLM film 24 from being reduced due to the change of the material. This prevents the device reliability from being degraded due to the falling of the solder ball bump 26 from the semiconductor chip upon mounting of the semiconductor chip on a printed wiring board or the failure in electric contact characteristic between the Cu electrode pad portion 12a and the solder ball bump 26 when the semiconductor chip undergoes a temperature cycle or a high temperature load.

Accordingly, the solder ball bump 26 appropriate to the next-generation high speed LSI adopting the Cu interconnection layer 12 can be formed, and since the barrier metal function is reinforced by adding the adhesion layer 20a to the BLM film 24, even if the semiconductor chip undergoes a thermal cycle test or a high temperature shelf test under a severe condition, it is possible to suppress the degradation of the adhesion strength and the electric contact characteristic between the Cu electrode pad portion 12a and the solder ball bump 26, and hence to significantly improve the reliability and durability of the final device product on which the semiconductor chip is mounted by the flip-chip mounting method.

In this embodiment, the silicon nitride film 14 is selectively etched using the resist film 16 having the pad opening portion 18 as a mask to expose the surface of the Cu electrode pad 12a, and of the adhesion layers 20a and 20b formed of the Al film or Ti film over the entire surface of the substrate, the adhesion layer 20b on the resist film 16 is removed together with the resist film 16 by lifting-off the resist film 16, to allow only the adhesion layer 20a on the Cu electrode pad portion 12a to remain. That is to say, the resist film 16 is used for both the etching mask and the lift-off film. Accordingly, it becomes possible to eliminate the necessity for provision of the step of forming a resist film for forming the adhesion layer 20a only on the Cu electrode pad portion 12a and the lithography step for patterning the resist film, and hence to effectively form the adhesion layer 20a in self-alignment over the entire surface of the Cu electrode pad portion 12a exposed by selective etching of the silicon nitride film 14 without increasing the number of the processing steps.

In this way, in combination with the function of the conventional BLM film 24 having been used to improve the adhesion between the Cu electrode pad portion 12a and the solder ball bump 26 and prevent the mutual diffusion therebetween, the adhesion layer 20a formed between the Cu electrode pad portion 12a and the BLM film 24 exhibits an effect of improving the electric contact characteristic, reliability, and durability of a device product on which the next-generation high speed LSI chip adopting the Cu interconnection layer 12 is mounted by the flip-chip mounting method.

In the above embodiment, description has been made using the two examples: one being configured by the combination of the Cu electrode pad portion 12a, the adhesion layer 20a formed of the Al film, and the BLM film 24 having the stacked structure of Cr/Cu/Au (Example 1); and the other being configured as the combination of the Cu electrode pad portion 12a, the adhesion layer 20a formed of the Ti film, and the BLM film 24 having the stacked structure of Ti/Cu/Au; however, the present invention is not limited thereto. For example, as the adhesion layer 20a, there may be used a metal film other than the Al film or Ti film, for example, a Cr film, Co film, Ni film, Mo film, Ag film, Ta film, W film or Au film. That is to say, a metal film capable of exhibiting good adhesion between the Cu electrode pad portion 12a and the BLM film 24 may be used as the adhesion layer 20a.

In the above embodiment, description has been made by way of the case using the Cu electrode pad portion 12a, that is, the Cu interconnection layer 12; however, the interconnection material of an LSI is not limited to Cu but may be an alloy containing Cu. That is to say, the present invention can be applied to the case using a Cu based interconnection layer.

The present invention can be also applied to the case using a metal other than a Cu based metal as the interconnection material. In this case, the present invention can keep up with the future LSIs by suitably selecting the material of the adhesion layer for increasing the adhesion between electrode pads and a barrier metal film in consideration of the new interconnection material other than Cu.

Although the adhesion layers 20a and 20b are formed by the sputtering method in the above embodiment; however, they may be formed by the electrolytic plating method or CVD method.

While the preferred embodiments of the present invention have been described using specific terms, such description is for illustrative purposes only, and it is to be understood that the structure of the semiconductor device and the processing conditions of the fabrication method for the semiconductor device may be suitably changed without departing from the spirit or scope of the present invention.

What is claimed is:

[1. A semiconductor device comprising:

A semiconductor substrate in contact with a multilayer interconnection layer, said multilayer interconnection layer comprising an electrode pad portion as an external connection terminal of the multilayer interconnection layer, said multilayer interconnection layer and said electrode pad portion made from copper or an alloy containing copper;

an adhesion layer formed directly on the electrode pad portion such that the adhesion layer is in contact with the electrode pad portion;

a barrier layer formed on the adhesion layer, wherein such barrier layer has a stacked structure of at least two different types of metal; and a solder bump formed on the barrier layer.]

[2. A semiconductor device according to claim 1, wherein said adhesion layer is made from at least one kind of metal selected from a group consisting of Al, Cr, Co, Ni, Mo, Ag, Ta, W and Au, or an alloy containing said at least one kind of metal.]

*3. A semiconductor device comprising:*

*a semiconductor substrate in contact with a multilayer interconnection layer, said multilayer interconnection layer comprising an electrode pad portion as an external connection terminal of the multilayer interconnection layer, said multilayer interconnection layer and said electrode pad portion made from copper or an alloy containing copper;*

*an adhesion layer formed directly on the electrode pad portion such that the adhesion layer is in contact with the electrode pad portion;*

*a first passivation layer formed on said adhesion layer;*

*a barrier layer formed on the adhesion layer, wherein such barrier layer has a stacked structure of at least two different types of metal; and*

*a solder bump formed on the barrier layer,*

*wherein said adhesion layer has an upper surface including a first portion that is in contact with said first*

*passivation layer and a second portion that contacts a bottom surface of said barrier layer.*

*4. A semiconductor device according to claim 3 wherein said first passivation layer has a lower surface that is in contact with said adhesion layer, an upper surface that is in contact with said barrier layer, and a side surface that is in contact with said barrier layer, wherein said side surface extends from said lower surface to said upper surface.*

*5. A semiconductor device according to claim 3, wherein said adhesion layer comprises Al.*

*6. A semiconductor device according to claim 3, wherein said adhesion layer comprises Co.*

*7. A semiconductor device according to claim 3, wherein said adhesion layer comprises Ni.*

*8. A semiconductor device according to claim 3, wherein said adhesion layer comprises Ta.*

*9. A semiconductor device according to claim 3, wherein said adhesion layer comprises W.*

*10. A semiconductor device according to claim 3, wherein said adhesion layer comprises Au.*

*11. A semiconductor device according to claim 3, further comprising a second passivation layer formed between said electrode pad portion and said first passivation layer.*

*12. A semiconductor device according to claim 11, wherein said second passivation layer has a lower surface that is in contact with said electrode pad portion, an upper surface that is in contact with said first passivation layer, and a side surface that is in contact with said first passivation layer, wherein said side surface extends from said lower surface to said upper surface.*

*13. A semiconductor device according to claim 11, wherein said first passivation layer is made of polyimide, and said second passivation layer is made of silicon nitride.*

*14. A semiconductor device according to claim 3, wherein a thickness of the barrier layer is thicker than a thickness of the adhesion layer.*

*15. A semiconductor device according to claim 3, wherein the multilayer interconnection layer and the electrode pad portion are made from the same material.*

*16. A semiconductor device according to claim 3, wherein said adhesion layer substantially contacts an entire bottom surface of said barrier layer.*

*17. A semiconductor device comprising:*

*a semiconductor substrate in contact with a multilayer interconnection layer, said multilayer interconnection layer comprising an electrode pad portion as an external connection terminal of the multilayer interconnection layer, said multilayer interconnection layer and said electrode pad portion made from copper or an alloy containing copper;*

*an adhesion layer formed directly on the electrode pad portion such that the adhesion layer is in contact with said electrode pad portion;*

*a first passivation layer formed on said adhesion layer,*

*a barrier layer formed on said adhesion layer, wherein such barrier layer has a stacked structure of at least two different types of metal; and*

*a solder bump formed on the barrier layer,*

*wherein said first passivation layer has an opening through which said barrier layer is electrically connected to said adhesion layer.*

*18. A semiconductor device according to claim 17, wherein said first passivation layer is formed directly on said adhesion layer, and said barrier layer is formed directly on said adhesion layer.*

*19. A semiconductor device according to claim 17, wherein said adhesion layer comprises Ta.*

*20. A semiconductor device according to claim 17, wherein a thickness of the barrier layer is thicker than a thickness of the adhesion layer.*

*21. A semiconductor device according to claim 17, wherein the multilayer interconnection layer and the electrode pad portion are made from the same material.*

*22. A semiconductor device according to claim 17, wherein said adhesion layer substantially contacts an entire bottom surface of said barrier layer.*

*23. A semiconductor device according to claim 17, further comprising a second passivation layer formed between said electrode pad portion and said first passivation layer.*

*24. A semiconductor device according to claim 23, wherein said second passivation layer has a lower surface that is in contact with said electrode pad portion, an upper surface that is in contact with said first passivation layer, and a side surface that is in contact with said first passivation layer, wherein said side surface extends from said lower surface to said upper surface.*

* * * * *